US007893697B2

(12) United States Patent
Ramsey et al.

(10) Patent No.: US 7,893,697 B2
(45) Date of Patent: Feb. 22, 2011

(54) CAPACITIVE DISTANCE SENSING IN SEMICONDUCTOR PROCESSING TOOLS

(75) Inventors: Craig C. Ramsey, West Linn, OR (US); DelRae H. Gardner, Tualatin, OR (US)

(73) Assignee: CyberOptics Semiconductor, Inc., Wilsonville, OR (US)

( * ) Notice: Subject to any disclaimer, the term of this patent is extended or adjusted under 35 U.S.C. 154(b) by 234 days.

(21) Appl. No.: 12/055,758

(22) Filed: Mar. 26, 2008

(65) Prior Publication Data

US 2008/0231291 A1 Sep. 25, 2008

Related U.S. Application Data

(63) Continuation-in-part of application No. 11/708,653, filed on Feb. 20, 2007.

(60) Provisional application No. 60/775,308, filed on Feb. 21, 2006, provisional application No. 60/775,394, filed on Feb. 21, 2006, provisional application No. 60/921,911, filed on Apr. 5, 2007.

(51) Int. Cl.
*G01R 27/26* (2006.01)
(52) U.S. Cl. ...................... 324/662; 324/686
(58) Field of Classification Search .......... 324/661, 324/662
See application file for complete search history.

(56) References Cited

U.S. PATENT DOCUMENTS

| | | | |
|---|---|---|---|
| 3,815,020 A | 6/1974 | Mayer | 324/61 |
| 3,835,264 A | 9/1974 | Overby | 179/111 |
| 3,876,883 A | 4/1975 | Broers et al. | 250/492 |
| 4,074,114 A | 2/1978 | Dobras | 235/462.07 |
| 4,119,381 A | 10/1978 | Muka et al. | 356/244 |
| 4,180,199 A | 12/1979 | O'Rourke et al. | 228/102 |
| 4,528,451 A * | 7/1985 | Petric et al. | 250/441.11 |

(Continued)

FOREIGN PATENT DOCUMENTS

CA 1 239 785 8/1988

(Continued)

OTHER PUBLICATIONS

International Search Report and Written Opinion for application No. PCT/US2008/008452, dated Nov. 6, 2008.

(Continued)

*Primary Examiner*—Timothy J Dole
(74) *Attorney, Agent, or Firm*—Christopher R. Christenson; Westman, Champlin & Kelley, P.A.

(57) ABSTRACT

A sensor for sensing a gap between the sensor and an object of interest within a semiconductor processing chamber is provided. The sensor includes a housing, a power source inside the housing, wireless communication circuitry, a controller, measurement circuitry and a plurality of capacitive plate pairs. The controller and wireless communication circuitry are coupled to each other, and to the power source. The plurality of capacitive plate pairs are configured to form capacitors having a capacitance that varies with the gap. Measurement circuitry is coupled to the controller and to the plurality of capacitive plate pairs. The measurement circuitry is configured to measure the capacitance of the capacitive plate pairs and provide indications thereof to the controller. The controller is configured to provide an indication relative to the gap based, at least in part, upon the measured capacitances.

11 Claims, 9 Drawing Sheets

U.S. PATENT DOCUMENTS

| | | | | |
|---|---|---|---|---|
| 4,633,578 | A | 1/1987 | Aine et al. | 29/612 |
| 4,701,096 | A | 10/1987 | Fisher | 414/416.08 |
| 4,753,569 | A | 6/1988 | Pryor | 700/250 |
| 4,791,482 | A | 12/1988 | Barry et al. | 348/136 |
| 4,843,287 | A | 6/1989 | Taft | 318/568.16 |
| 4,918,627 | A | 4/1990 | Garcia et al. | 702/82 |
| 4,985,601 | A | 1/1991 | Hagner | 174/261 |
| 5,055,637 | A | 10/1991 | Hagner | 174/260 |
| 5,076,794 | A | 12/1991 | Ganthier | 439/70 |
| 5,175,601 | A | 12/1992 | Fitts | 356/604 |
| 5,232,331 | A | 8/1993 | Kasai et al. | 414/802 |
| 5,248,553 | A | 9/1993 | Miyashita et al. | 428/297.1 |
| 5,265,957 | A | 11/1993 | Moslehi et al. | 374/1 |
| 5,267,143 | A | 11/1993 | Pryor | 700/56 |
| 5,298,363 | A | 3/1994 | Weiss | 430/296 |
| 5,301,248 | A | 4/1994 | Takanori et al. | 382/147 |
| 5,321,989 | A | 6/1994 | Zimmer et al. | 73/724 |
| 5,371,728 | A | 12/1994 | Sakai et al. | 369/126 |
| 5,382,911 | A | 1/1995 | Cotler et al. | 324/662 |
| 5,393,706 | A | 2/1995 | Mignardi et al. | 225/2 |
| 5,435,682 | A | 7/1995 | Crabb et al. | 414/217 |
| 5,442,297 | A | 8/1995 | Verkuil | 324/702 |
| 5,444,637 | A | 8/1995 | Smesny et al. | 364/556 |
| 5,521,123 | A | 5/1996 | Komatsu et al. | 437/209 |
| 5,573,728 | A | 11/1996 | Loesch et al. | 422/90 |
| 5,619,027 | A | 4/1997 | Ackley | 235/462.01 |
| 5,641,911 | A | 6/1997 | Ryhanen | 73/718 |
| 5,642,293 | A | 6/1997 | Manthey et al. | 702/42 |
| 5,675,396 | A | 10/1997 | Tsunehiro | 349/59 |
| 5,680,384 | A | 10/1997 | Seki et al. | 369/112.29 |
| 5,721,677 | A | 2/1998 | Pryor | 700/61 |
| 5,726,066 | A | 3/1998 | Choi | 437/3 |
| 5,742,702 | A | 4/1998 | Oki | 382/156 |
| 5,783,341 | A | 7/1998 | Uzawa | 430/22 |
| 5,784,282 | A | 7/1998 | Abitbol et al. | 700/186 |
| 5,786,704 | A | 7/1998 | Kim | 324/765 |
| 5,805,289 | A | 9/1998 | Corby et al. | 356/614 |
| 5,854,880 | A | 12/1998 | Pryor | 700/259 |
| 5,956,417 | A | 9/1999 | Pryor | 382/154 |
| 5,962,909 | A | 10/1999 | Jerominek et al. | 257/522 |
| 5,969,639 | A | 10/1999 | Lauf et al. | 340/870.17 |
| 5,973,788 | A | 10/1999 | Pettersen et al. | 356/614 |
| 5,981,116 | A | 11/1999 | Ota | 430/22 |
| 6,010,009 | A | 1/2000 | Peterson et al. | 206/711 |
| 6,011,294 | A | 1/2000 | Wetzel | 257/434 |
| 6,013,236 | A | 1/2000 | Takahashi et al. | 423/345 |
| 6,022,811 | A | 2/2000 | Yuuki et al. | 438/758 |
| 6,075,909 | A | 6/2000 | Ressl | 385/14 |
| 6,106,457 | A | 8/2000 | Perkins et al. | 600/175 |
| 6,129,278 | A | 10/2000 | Wang et al. | 235/462.01 |
| 6,175,124 | B1 | 1/2001 | Cole et al. | 257/48 |
| 6,184,773 | B1 | 2/2001 | Bonne et al. | 338/25 |
| 6,206,441 | B1 | 3/2001 | Wen et al. | 294/1.1 |
| 6,210,754 | B1 | 4/2001 | Lu et al. | 427/248.1 |
| 6,212,072 | B1 | 4/2001 | Boutin et al. | 361/704 |
| 6,232,615 | B1 | 5/2001 | Van Empel | 250/548 |
| 6,244,121 | B1 | 6/2001 | Hunter | 73/865.9 |
| 6,275,742 | B1 | 8/2001 | Sagues et al. | 700/213 |
| 6,300,974 | B1 | 10/2001 | Viala et al. | 348/61 |
| 6,323,952 | B1 | 11/2001 | Yomoto et al. | 356/600 |
| 6,325,536 | B1 | 12/2001 | Renken et al. | 374/161 |
| 6,326,228 | B1 | 12/2001 | Hughes et al. | 438/49 |
| 6,373,271 | B1 | 4/2002 | Miller et al. | 324/760 |
| 6,389,158 | B1 | 5/2002 | Pettersen et al. | 382/154 |
| 6,465,281 | B1 | 10/2002 | Xu et al. | 438/127 |
| 6,466,325 | B1 | 10/2002 | Gooch | 356/620 |
| 6,468,816 | B2 | 10/2002 | Hunter | 438/14 |
| 6,476,825 | B1 | 11/2002 | Croy et al. | 715/716 |
| 6,480,537 | B1 | 11/2002 | Agrawal et al. | 375/240 |
| 6,518,775 | B2 | 2/2003 | Yu et al. | 324/661 |
| 6,526,668 | B1 | 3/2003 | Beckhart et al. | 33/366.11 |
| 6,532,403 | B2 | 3/2003 | Beckhart et al. | 700/254 |
| 6,535,650 | B1 | 3/2003 | Poulo et al. | 382/284 |
| 6,607,951 | B2 | 8/2003 | Chen et al. | 438/199 |
| 6,625,305 | B1 | 9/2003 | Keren | 382/162 |
| 6,628,803 | B1 | 9/2003 | Wakashiro et al. | 382/103 |
| 6,681,151 | B1 | 1/2004 | Weinzimmer et al. | 700/259 |
| 6,691,068 | B1 | 2/2004 | Freed et al. | 702/187 |
| 6,700,391 | B2 | 3/2004 | Strack et al. | 324/662 |
| 6,724,930 | B1 | 4/2004 | Kosaka et al. | 382/154 |
| 6,734,027 | B2 | 5/2004 | Jonkers | 438/14 |
| 6,801,257 | B2 | 10/2004 | Segev et al. | 348/296 |
| 6,807,503 | B2 | 10/2004 | Ye et al. | 702/117 |
| 6,816,755 | B2 | 11/2004 | Habibi et al. | 700/259 |
| 6,836,212 | B2 | 12/2004 | Sawinski | 340/539.23 |
| 6,852,975 | B2 | 2/2005 | Riegl et al. | 250/334 |
| 6,852,988 | B2 | 2/2005 | Li | 250/491.1 |
| 6,891,276 | B1 | 5/2005 | Chiang | 257/790 |
| 6,898,558 | B2 | 5/2005 | Klekotka | 702/188 |
| 6,925,356 | B2 | 8/2005 | Schauer et al. | 700/213 |
| 6,958,768 | B1 | 10/2005 | Rao et al. | 348/86 |
| 6,966,235 | B1 | 11/2005 | Paton | 73/865.9 |
| 6,985,169 | B1 | 1/2006 | Deng et al. | 348/61 |
| 6,990,215 | B1 | 1/2006 | Brown et al. | 382/106 |
| 7,031,560 | B2 | 4/2006 | Lelong-Feneyrou et al. | 385/12 |
| 7,035,913 | B2 | 4/2006 | Culp et al. | 709/218 |
| 7,059,936 | B2 | 6/2006 | Prasad | 45/8 |
| 7,135,852 | B2 | 11/2006 | Renken et al. | 324/158.1 |
| 7,149,643 | B2 | 12/2006 | Renken et al. | 702/122 |
| 7,158,857 | B2 | 1/2007 | Schauer et al. | 700/218 |
| 7,180,607 | B2 | 2/2007 | Kyle et al. | 356/614 |
| 7,206,080 | B2 | 4/2007 | Kochi et al. | 356/611 |
| 7,222,789 | B2 | 5/2007 | Longacre et al. | 235/450 |
| 7,289,230 | B2 | 10/2007 | Ramsey et al. | 356/621 |
| 2001/0034222 | A1 | 10/2001 | Roustaei et al. | 455/403 |
| 2001/0050769 | A1 | 12/2001 | Fujinaka | 356/121 |
| 2002/0006675 | A1 | 1/2002 | Shigaraki | 438/4 |
| 2002/0006687 | A1 | 1/2002 | Lam | 438/118 |
| 2002/0028629 | A1 | 3/2002 | Moore | 451/6 |
| 2002/0078770 | A1 | 6/2002 | Hunter | 73/865.9 |
| 2002/0092369 | A1 | 7/2002 | Hunter | 73/865.9 |
| 2002/0101508 | A1 | 8/2002 | Pollack | 348/85 |
| 2002/0148307 | A1 | 10/2002 | Jonkers | 73/865.9 |
| 2003/0001083 | A1 | 1/2003 | Corrado et al. | 250/239 |
| 2003/0112448 | A1 | 6/2003 | Maidhof et al. | 356/603 |
| 2003/0127589 | A1 | 7/2003 | Corrado et al. | 250/239 |
| 2003/0133372 | A1 | 7/2003 | Fasen et al. | 369/43 |
| 2003/0160883 | A1 | 8/2003 | Ariel et al. | 348/308 |
| 2003/0209097 | A1 | 11/2003 | Hunter | 73/865.9 |
| 2003/0223057 | A1 | 12/2003 | Ramsey et al. | 356/147 |
| 2004/0158426 | A1 | 8/2004 | Gershenzon et al. | 702/149 |
| 2004/0202362 | A1 | 10/2004 | Ishikawa et al. | 382/153 |
| 2004/0231409 | A1 | 11/2004 | Lelong-Feneyrou et al. | 73/152.51 |
| 2005/0017712 | A1 | 1/2005 | Le | 324/230 |
| 2005/0224899 | A1 | 10/2005 | Ramsey et al. | 257/414 |
| 2005/0224902 | A1 | 10/2005 | Ramsey et al. | 257/433 |
| 2005/0233770 | A1 | 10/2005 | Ramsey et al. | 455/561 |
| 2006/0000411 | A1 | 1/2006 | Seo et al. | 118/715 |
| 2006/0005632 | A1 | 1/2006 | Chen et al. | 73/780 |
| 2006/0055415 | A1 | 3/2006 | Takita | 324/658 |
| 2006/0118518 | A1 | 6/2006 | Rusu et al. | 216/67 |
| 2006/0222480 | A1 | 10/2006 | Duhamel et al. | 414/744.8 |
| 2006/0289296 | A1 | 12/2006 | Maruyama et al. | 204/192.32 |
| 2007/0222462 | A1 | 9/2007 | Gardner et al. | 324/662 |
| 2008/0231291 | A1 | 9/2008 | Ramsey et al. | |
| 2008/0246493 | A1 | 10/2008 | Gardner et al. | |
| 2009/0015268 | A1 | 1/2009 | Gardner et al. | |

FOREIGN PATENT DOCUMENTS

| | | |
|---|---|---|
| DE | 10105774 A1 | 8/2001 |
| EP | 0583007 B1 | 10/1997 |
| EP | 1150187 A2 | 10/2001 |

| | | |
|---|---|---|
| EP | 1184805 A1 | 3/2002 |
| EP | 1 253 471 | 10/2002 |
| JP | 1082823 | 9/1987 |
| JP | 62054108 | 9/1987 |
| JP | 3214783 A2 | 9/1991 |
| JP | 06163340 | 11/1992 |
| JP | 06076193 | 6/1993 |
| JP | 7074229 | 6/1993 |
| JP | 163340 | 6/1994 |
| JP | 7280644 A2 | 10/1995 |
| JP | 8233855 A2 | 9/1996 |
| JP | 11307606 | 4/1998 |
| JP | 11260706 | 9/1999 |
| JP | 2004-276151 | 10/2004 |
| WO | WO 00/12263 | 3/2000 |
| WO | WO 00/70495 | 11/2000 |
| WO | WO 01/65317 A2 | 9/2001 |
| WO | WO 01/88976 | 11/2001 |
| WO | WO 02/17364 | 2/2002 |
| WO | WO 02/29385 | 4/2002 |
| WO | WO 02/47115 | 6/2002 |
| WO | WO 03/060989 A1 | 7/2003 |

OTHER PUBLICATIONS

"Final Report on Wireless Wafer Proof-of-Principle," J.B. Wilgen, et al., Oak Ridge National Laboratory, Jan. 18, 1998.

"Autonomous Micro-sensor Arrays for Process Control of Semiconductor Manufacturing Processes," Darin Fisher, et al., Jun. 4, 1998. NSF Award Abstract—#9628420, https://www.fastlane.nsf.gov/servlet/showaward?award=9628420.

International Preliminary Examination Report from International Application No. PCT/US03/03247, filed Feb. 4, 2003.

Invitation to Pay Fees from International Application No. PCT/US2005/007656, filed Mar. 3, 2005.

International Search Report from International Application No. PCT/US2005/007418, filed Mar. 9, 2005.

International Preliminary Examination Report and Written Opinion from International Application No. PCT/US2005/007656, filed Mar. 9, 2005.

Notification of Transmittal of the International Preliminary Report from International Application No. PCT/US05/007423, filed Mar. 9, 2005; Notification of Transmittal of the International Search Report and Written Opinion from International Application No. PCT/US05/007423, filed Mar. 9, 2005.

Notification of Transmittal of the International Search Report and Written Opinion from International Application No. PCT/US05/007656, filed Mar. 9, 2005; Notification of Transmittal of the International Preliminary Report on Patentability from International Application No. PCT/US05/007656, filed Mar. 9, 2005.

Notification of Transmittal of International Preliminary Examination Report from International Application No. PCT/US05/007418, filed Mar. 9, 2005; Notification of the International Search Report and Written opinion from International Application No. PCT/US05/007418, filed Mar. 9, 2005.

Notification of Transmittal of the International Search Report and Written Opinion from International Application No. PCT/US07/004350, filed Feb. 20, 2007.

First Office Action of the Chinese Patent Office in foreign application No. 200580007352.9 filed Mar. 9, 2005.

First Office Action of the Chinese Patent Office in foreign application No. 200580007349.7 filed Mar. 9, 2005.

First Office Action of the Chinese Patent Office in foreign application No. 200580007354.8 filed Mar. 9, 2005.

Notification of Transmittal of the International Preliminary Report from International Application No. PCT/US07/004350, filed Feb. 20, 2007.

Second Office Action of the Chinese Patent Office in foreign application No. 200580007352.9 filed Mar. 9, 2005.

Second Office Action of the Chinese Patent Office in foreign application No. 200580007349.7 filed Mar. 9, 2005.

Second Office Action of the Chinese Patent Office in foreign application No. 200580007354.8 filed Mar. 9, 2005.

The First Office Action for Chinese Patent application No. 200780006216.7 dated May 12, 2010.

* cited by examiner

CAPACITIVE DISTANCE SENSING IN SEMICONDUCTOR PROCESSING TOOLS

CROSS-REFERENCE TO RELATED APPLICATION

The present application is a Continuation-In-Part application of U.S. patent application Ser. No. 11/708,653 filed Feb. 20, 2007 which application is based on and claims the benefit of U.S. provisional patent application Ser. No. 60/775,308, filed Feb. 21, 2006, and U.S. provisional patent application Ser. No. 60/775,394, filed Feb. 21, 2006; and the present application is based on and claims the benefit of U.S. provisional patent application Ser. No. 60/921,911, filed Apr. 5, 2007 the content of which is herein incorporated by reference in its entirety.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

During the manufacture of semiconductor wafers and/or LCD panels, such as are used in flat panel television sets, a substrate is exposed to gas in which an electrically generated plasma is formed. The gas enters from a "showerhead" like fixture positioned above the substrate, which also functions as one of the electrodes to form the plasma. In order to maximize yield, it is important that the distance from the showerhead to the substrate be consistent across the entire substrate surface. In other words, it is important that the plane of the substrate surface and the plane of the showerhead be parallel. It is, accordingly, very important in the setup of the semiconductor processing tool where the process takes place that the relative positions of the showerhead and substrate, or the "platen" that holds the substrate, be adjusted to be parallel. This requires the ability to measure the relative positions of the showerhead and substrate, particularly, the distance between them at various points, which can yield a measure the parallelism of the two.

One way that such distance/parallelism measurements have been performed in the past was by using a measurement device that was placed on the platen under the showerhead. Such measurement devices typically included compressible internal springs. The measurement device would rest on the platen and contact the showerhead, and be compressed as the showerhead was lowered. In the lowered state of the showerhead, the thickness of the measurement device at any point is the distance between the platen and the showerhead. Measuring equipment inside the measurement device would measure the thickness of the device, thereby measuring the distance from the platen to the showerhead. Measurements thus made at multiple points between the platen and the showerhead were able to provide an overall measure of parallelism of the platen and showerhead. However, such a device, in its uncompressed state, was generally larger than the nominal distance between the platen and the showerhead. Accordingly, it was necessary to compress the measurement device before placing the device on the platen, or else the showerhead would have to be removed first. Additionally, these measurement devices generally provided information relative to the parallelism using a cable that ran out of the semiconductor processing chamber door to a display device. The cable was flat and able to pass through the door even when the door was closed, as it is necessary that the measurements are made, and adjustments performed, when the processing chamber is closed. The cable was generally prone to failure because it passed through and was compressed in the seal of the door.

Accordingly, there was a need to perform the measurement and data display without cable. More recently, techniques for sensing conditions within a substrate processing system using wireless communication have been developed. U.S. Pat. No. 6,468,816 reports a method for sensing conditions within a substrate processing system. That reference discloses the ability to sense a variety of conditions within the processing system. The reference also provides a distance probe which can ensure that the wafer surfaces are both parallel to and at the proper distance from the target or showerhead of the process chamber. The distance probe is disclosed to include contacting sensors or electro-optical sensors arranged at a number of locations on the surface of the probe platform to determine the distance from and angle of inclination between the probe and the target or showerhead. While such advances have assisted in the setup and operation of the semiconductor processing tools, the provision of the extremely low-profile distance sensor has been lacking.

Yet another problem with respect to the adjustment of parallelism of a platen with respect to a showerhead of a semiconductor processing tool is the requirement that a technician monitor from three to eight individual distance measurements while adjusting the orientation and elevation of the platen relative to the showerhead or target. It was generally not practical to provide platen or showerheads or targets that were perfectly flat, so it was generally not possible to adjust the platen so that all of the distance measurements were the same. Accordingly, a technician's judgment was relied upon to determine when the adjustments were "good enough."

Accordingly, there exists a continuing need for extremely low-profile distance/parallelism sensing within a semiconductor processing tool, as well as better methods for automatically measuring and adjusting the distance between the platen and showerhead of a semiconductor-processing tool.

SUMMARY OF THE INVENTION

A sensor for sensing a gap between the sensor and an object of interest within a semiconductor processing chamber is provided. The sensor includes a housing, a power source inside the housing, wireless communication circuitry, a controller, measurement circuitry and a plurality of capacitive plate pairs. The controller and wireless communication circuitry are coupled to each other, and to the power source. The plurality of capacitive plate pairs are configured to form capacitors having a capacitance that varies with the gap. Measurement circuitry is coupled to the controller and to the plurality of capacitive plate pairs. The measurement circuitry is configured to measure the capacitance of the capacitive plate pairs and provide indications thereof to the controller. The controller is configured to provide an indication relative to the gap based, at least in part, upon the measured capacitances.

DETAILED DESCRIPTION OF ILLUSTRATIVE EMBODIMENTS

In accordance with various aspects of the present invention, capacitance is sensed as an indication of a distance between two objects. More specifically, a device in accordance with embodiments of the present invention generally includes at least one capacitive plate that forms a capacitor with another conductive object, the capacitance of which varies as a function of the distance between the plate and the object. Capacitance-based sensing is a known technique for determining the distance from a sensor to the surface of an object. Generally, the surface of the object is conductive and a low impedance signal path exists between the object and the "ground" of the sensing surface. Thus, the complete circuit includes the sensing device, the low impedance signal path between the object and the sensing device, the object, and the capacitor formed between the object and the sensing device. The capacitance is a function of the separation between the object and the sensor, and this fact allows the separation to be determined from the measured capacitance. In many cases, the low-impedance signal path between the sensing device and the object may consist of capacitance that exists between the object and the surrounding environment and between the sensing device and the surrounding environment. When this capacitance is large enough, or when there is a direct conductive connection, the impedance has minimal effects on the measured capacitance. In the case that the ground path impedance is relatively large, this method is not useful because the ground path impedance is added to the impedance of capacitance to be measured so that an accurate measure of capacitance is not possible.

In accordance with one embodiment of the present invention, capacitance between a capacitive plate of a sensor and an object of interest is measured regardless of the impedance of the signal path between the object and the ground of the sensor.

Figure 1:
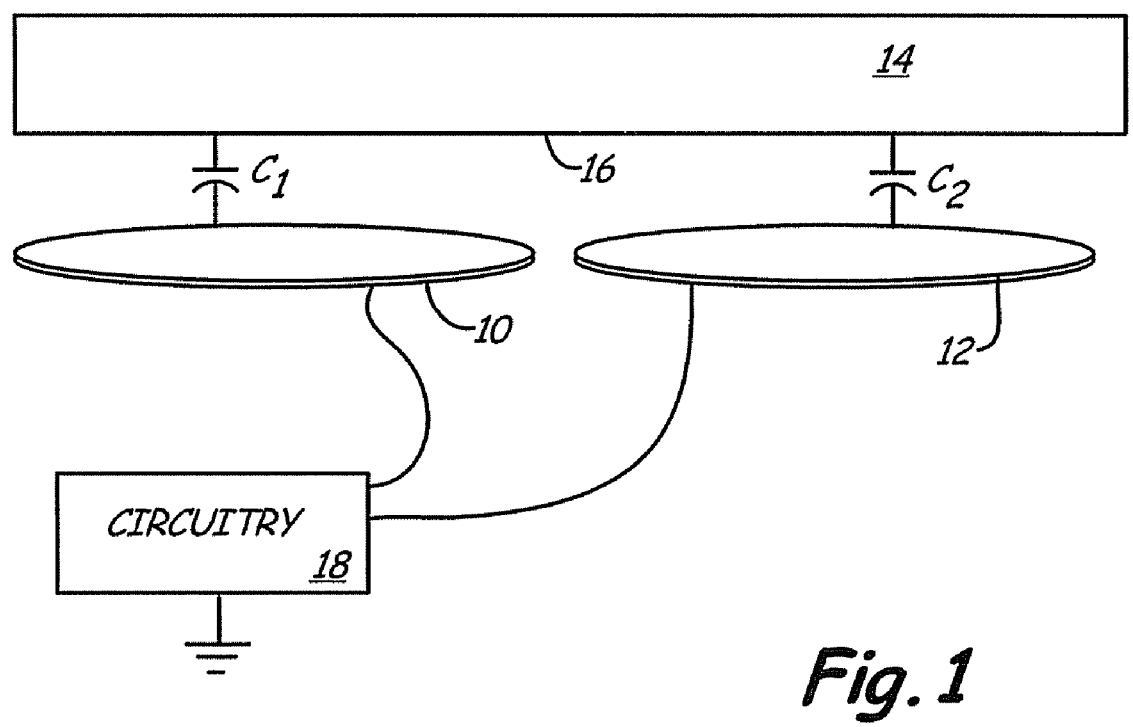
FIG. 1 is a diagrammatic view of sensing distance to an object of interest using capacitance in accordance with an embodiment of the present invention.

FIG. 1 is a diagrammatic view of a capacitance-based distance sensor that includes two plates 10, 12 on a surface (not shown) facing object 14. Typically, object 14 is flat on surface 16 facing plates 10 and 12. Capacitors $C_1$ and $C_2$ exist between plates 10, 12 and surface 16 of object 14, respectively. If surface 16 of object 14 is conductive, capacitors $C_1$ and $C_2$ are in series electrically. Capacitors $C_1$ and $C_2$ are treated as one equivalent capacitor by sensing circuitry 18 which measures the capacitance. The measured capacitance is a function of the separation between the sensor having capacitance plates 10 and 12, and surface 16 of object 14. When all other factors are accounted for, the measured capacitance can be converted into a measure of separation.

Figure 2:
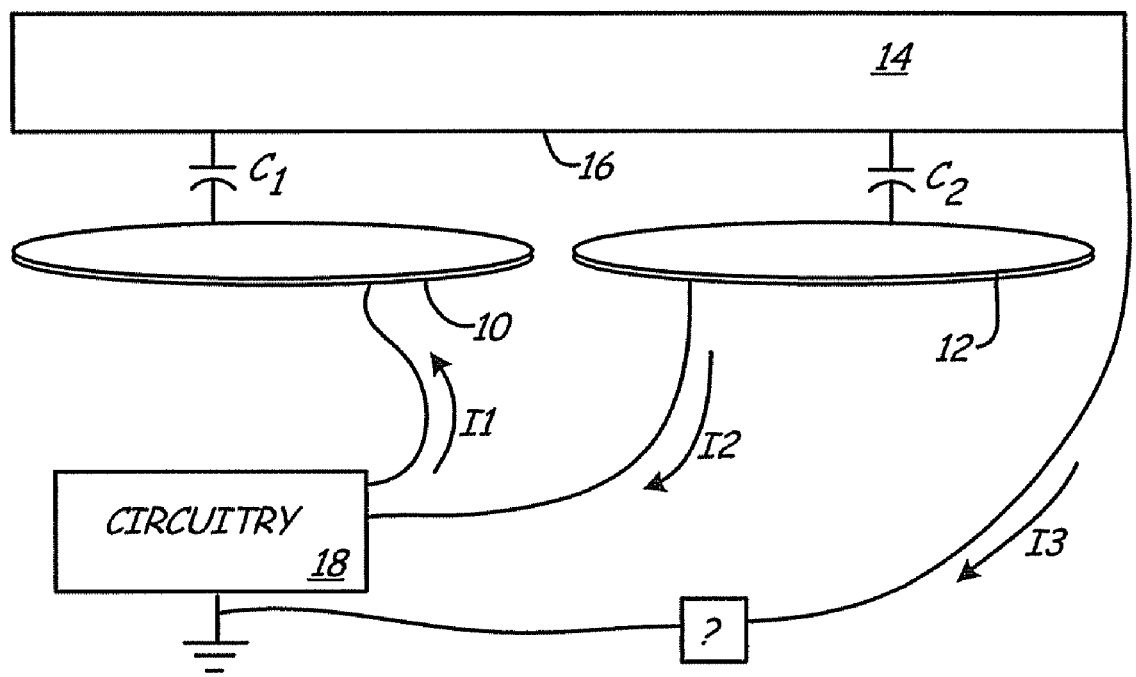
FIG. 2 is a diagrammatic view of sensing distance to an object of interest using capacitance in accordance with an embodiment of the present invention.

In order to make the measurement, a voltage differential is applied to plates 10, 12 of the sensor, and the amount of charge that is conducted between plates 10, 12 as a result of the voltage is measured. One way of doing this is with a specially-modified sigma-delta modulator circuit (a known type of analog-to-digital converter), one example of which is provided under the trade designation AD7745 available from Analog Devices Inc. This type of so circuit works by applying a difference voltage to plates 10, 12. The voltage causes current to flow to charge the capacitor (or equivalent capacitor) and this charge is accumulated and measured by the circuit in the device. However, object 14 presents a third path in which charge can flow, that is, in addition to the current flow to and from plates 10, 12 of the equivalent capacitor. Accordingly, current can also flow from object 14 to circuitry 18 via the body or housing of the sensor (not shown in FIG. 1) and so via the circuit ground. This conductive path is illustrated in FIG. 2 as current I3. Currents I1 and I2 are the currents caused by charging the capacitor or equivalent capacitor, and I1 would equal I2 in the absence in the third current path I3. Current I3 is the current that may flow between the object and the ground of circuitry 18. Current I3 is unknown, because the impedance of the path is unknown, and reduces the validity of the measurement of I1 and/or I2, or can render the measurement impossible, depending upon the impedance of the third path.

In order to provide an accurate measurement of capacitance, one embodiment of the present invention effectively eliminates the flow of charge in this third path. This is done by the choice of voltages applied to plates 10 and 12. The difference voltage from the sigma-delta modulator circuit is applied such that it is positive on one plate and negative on the other plate, relative to the body of the sensor. The ratio of the magnitude of the two voltages is the same as the ratio of impedance of the two capacitors, or the inverse of the ratio of capacitance of the two capacitors. This is possible because even though the capacitors are variable with separation, the ratio of the capacitors remains the same. The ratio is determined by the surface areas of plates 10, 12. The result of the voltage ratio being proportional to the impedance ratio is that the same amount of charge is moved in each capacitor, and therefore no charge flows in the third path. This means that the third path, that is, any connection or capacitive coupling between object 14 and sensor 18, has no effect on the measurement, and the measurement can be made regardless of the connection or lack of connection between the object 14 and the sensor 18.

Figure 3:
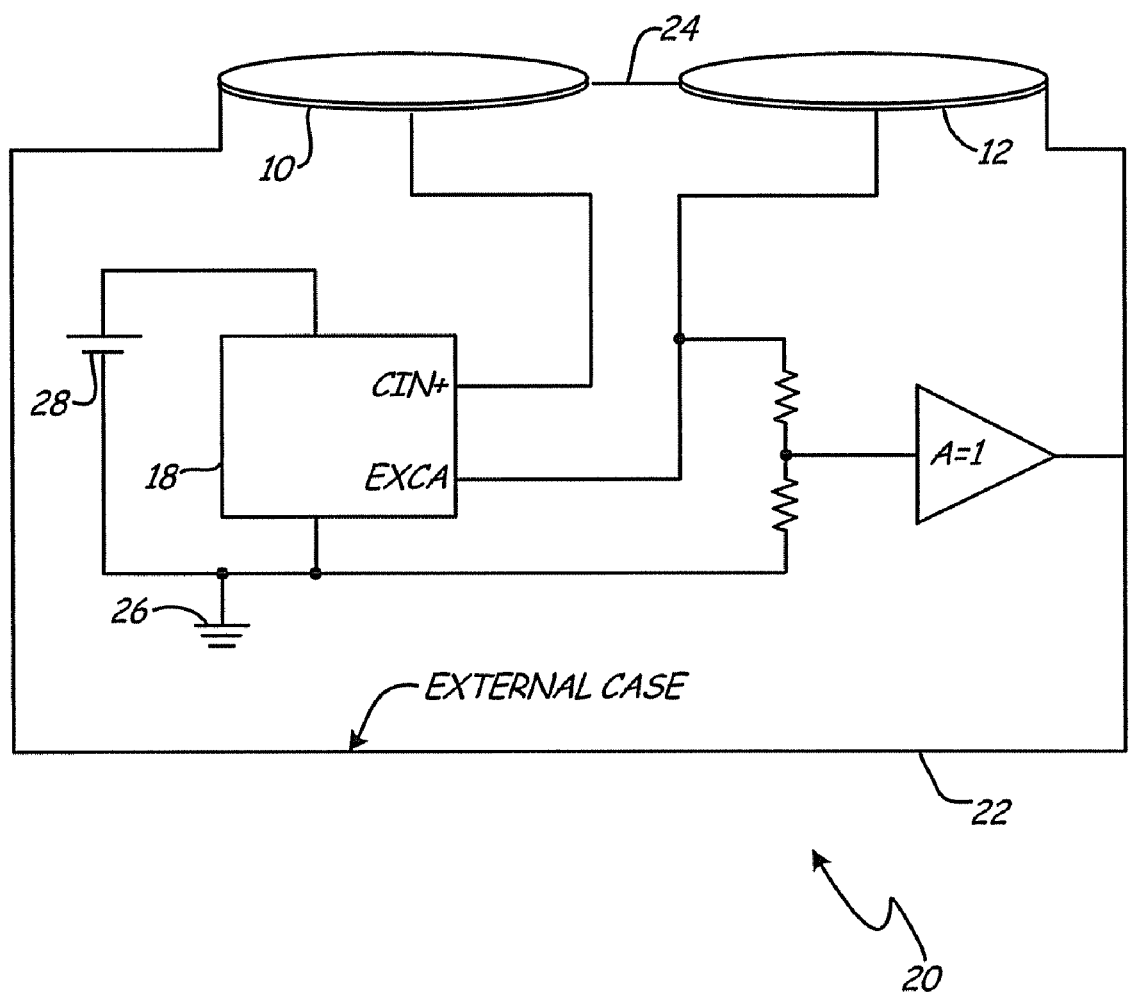
FIG. 3 is a diagrammatic view of a sensor scheme to sense distance to an object of interest using capacitance in accordance with an embodiment of the present invention.

FIG. 3 is a diagrammatic view of a capacitance based distance sensor in accordance with an embodiment of the present invention. Sensor 20 includes an external case or housing 22 containing measurement circuitry 18. Measurement circuitry 18 is coupled to each of capacitance plates 10 and 12. More particularly, circuitry 18 is preferably a sigma-delta modulator circuit sold under the trade designation AD7745 available from Analog Device Inc. As indicated in FIG. 3, circuitry 18 includes a CIN+ line that is electrically coupled to capacitive plate 10. Additionally, circuitry 18 includes an EXCA line that is electrically coupled to capacitive plate 12, It is important to note that FIG. 3 shows a line 24 extending between capacitance plates 10 and 12. Line 24 is merely intended to indicate a continuation of external case 22, and not an electrical connection between capacitance plates 10 and 12. Circuitry 18 provides an excitation voltage on line EXCA, which excitation voltage has an amplitude that varies over time as a square wave. Capacitive plate 10 is coupled to sensing input CIN+. The voltage on plate 10 remains at zero volts with respect to circuit ground 26. The excitation voltage is divided by a voltage divider set at the ratio of the impedance of the capacitors, and buffered, and drives the external case 22 which surrounds the entire circuit except capacitive plates 10, 12. The circuitry of device 20 is powered internally, such as by a battery, illustrated diagrammatically as source 28. The result is that, as seen from outside sensor 20, case 22 is the apparent circuit ground for reference voltage, and one plate goes positive relative to case 22 while the other plate goes negative. Under these conditions, an accurate measurement of separation between sensor 20 and an object is possible. While the embodiments of the invention illustrated with respect to FIGS. 1-3 shows a pair of capacitive plates, any number of two or more plates can be used.

Figure 4:
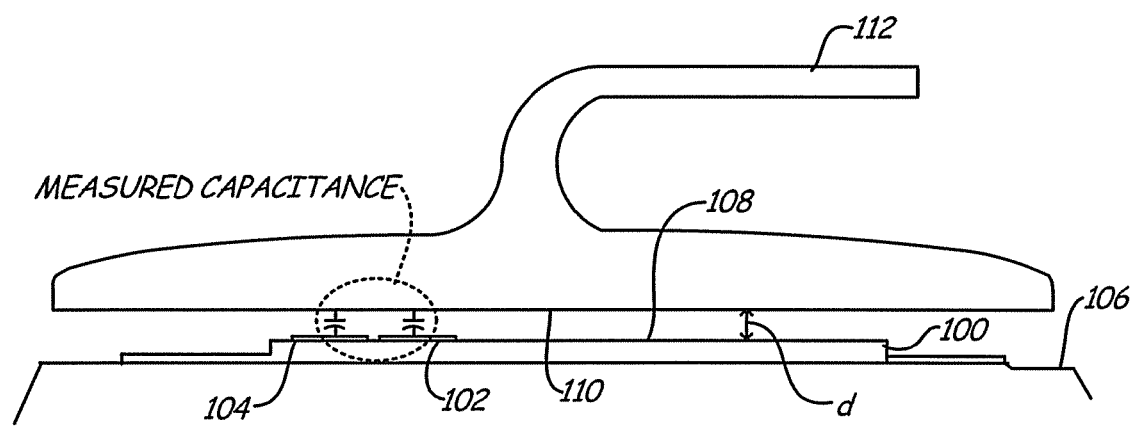
FIG. 4 is a diagrammatic view of a sensor disposed upon a platen and sensing distance to a showerhead using capacitance in accordance with an embodiment of the present invention.

In accordance with one embodiment of the present invention, capacitance-based sensing is used in a sensor to sense distance and/or parallelism between a platen and a showerhead in a semiconductor-processing chamber. FIG. 4 illustrates capacitive-base sensing device 100 including a plurality of capacitive plates 102, 104. Device 100 is shown resting upon platen 106 and senses the distance d between top surface 108 of sensor 100 and bottom surface 110 of showerhead 112. As illustrated in FIG. 4, each of plates 102 and 104 form respective capacitors with surface 110 of showerhead 112. Sensor 100 can take any suitable form, and is preferably embodied within a physical package that resembles substrates that are processed by the system. Thus, for a semiconductor processing system, sensor 100 represents a semiconductor wafer or LCD flat panel. While sensor 100 measures distance d as a function of the capacitance observed using plates 102 and 104, the actual distance between platen 106 and surface 110 of showerhead 112 can easily be computed by sensor 100 merely by adding the thickness of sensor 100 to the measured distance d.

While embodiments of the present invention listed thus far generally sense distance to the object or showerhead directly, embodiments also include extending a surface of the sensor to contact the showerhead, and employing the capacitance to measure a distance of the extension.

Figure 5:
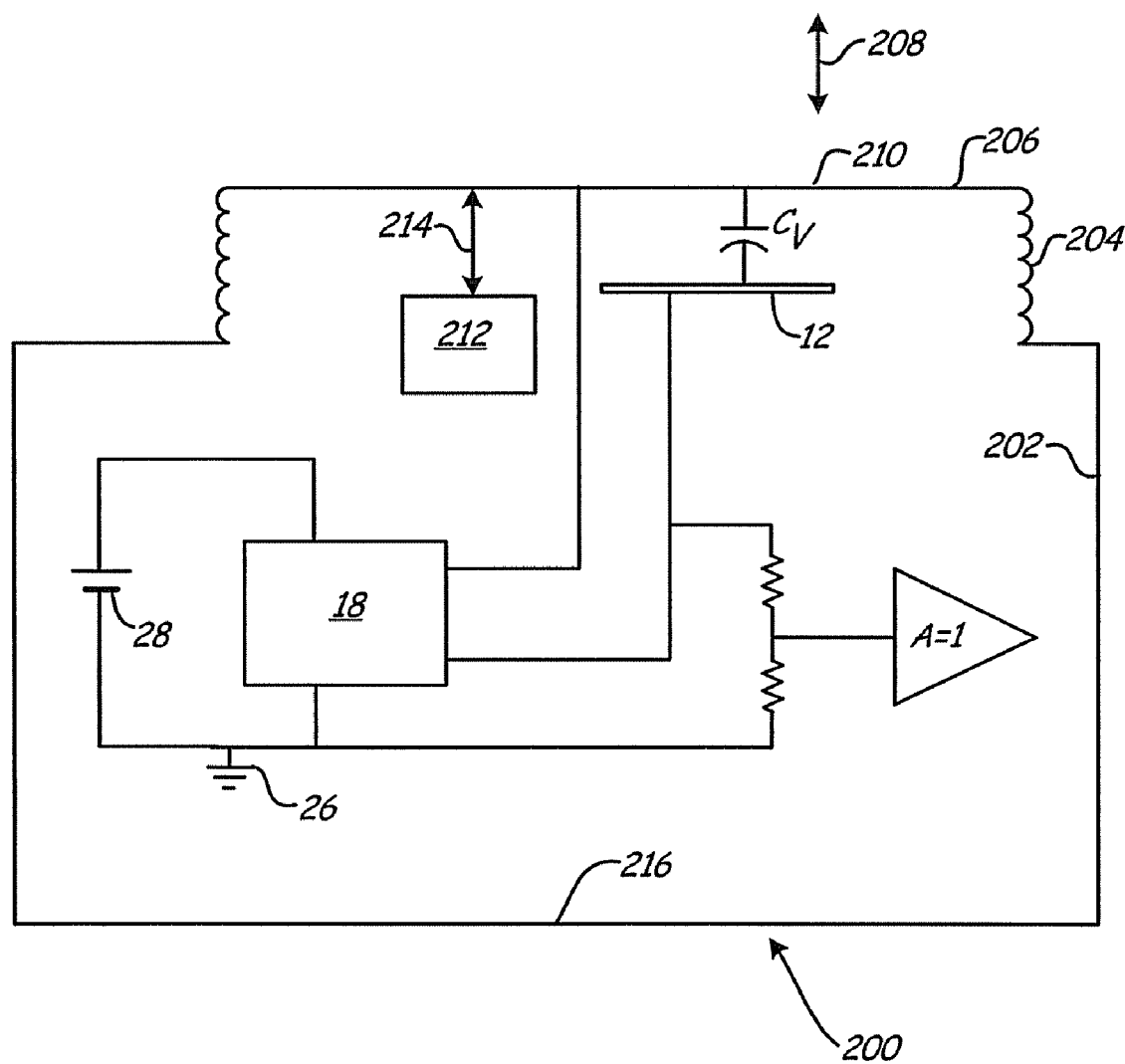
FIG. 5 is a diagrammatic view of a sensor for sensing a distance between a first surface and a second surface by measuring capacitance in accordance with an embodiment of the present invention.

FIG. 5 is a diagrammatic view of such an expandable sensor. Sensor 200 resembles sensor 20 described with respect to FIG. 3, and like components are numbered similarly. The housing of sensor 200 differs from housing 22 of sensor 20 in that housing 202 accommodates an expandable portion 204 that is expandable to allow surface 206 to move in the direction indicated by arrow 208. Within sensor 200, and proximate surface 206, capacitive plate 210 is mounted so as to form a capacitor with capacitive plate 12. The capacitor so formed is illustrated diagrammatically as $C_v$. Surface 206 of sensor 200 is movable by actuator 212 that is operably coupled to surface 206 as indicated at line 214. Actuator 212 can be any suitable device that is able to generate suitable motion of surface 206 based upon an energization or command signal. Suitable examples of actuator 212 employ utilization of magnetic, electric, electromagnetic, piezoelectric, mechanical and/or pneumatic techniques. For example, actuator 212 may simply include a small electric motor that engages a mechanism to drive surface 206 in one direction or the other. Alternatively, actuator 212 may include an electromagnet, a permanent magnet, or any combination thereof to selectively drive surface into or away from a showerhead surface. Actuator 212 is coupled to a controller (not illustrated in FIG. 5) and provides actuation based upon commands or signals received from the controller. Once actuator 212 drives surface 206 into contact with the showerhead, circuitry 18 senses capacitance CV between plates 12 and 210. The sensed capacitance is indicative of the distance between plates 12 and 210. Then, knowing the relative position of plate 12 fixed within sensor 200, the total distance from surface 206 to the bottom surface 216 of case 202 can be provided. Additionally, the sensed distance can be validated, in some embodiments, by comparing the computed distance with commands sent to, or otherwise provided to actuator 212. For example, if actuator 212 is a stepper motor that engages a mechanism to raise or lower surface 206, the number of counts or pulses sent to the stepper motor can be compared with the sensed distance. While the precision of the sensed distance may be much greater than that otherwise available from actuator 212, the mere agreement of the two values may provide important validation.

Alternatively, actuation may be effected by ambient pressure in the following manner. In this embodiment case 202 is hermetically sealed, with the inside cavity being filled with air or an appropriate gas at a reduced pressure less than atmospheric pressure. When the sensor is placed in an atmospheric condition the external air pressure exceeds the internal pressure and causes the sensor to be compressed. When the sensor is placed in a low pressure or vacuum, the internal pressure exceeds the external pressure, causing case 202 to expand to its maximum height or until it contacts the showerhead. In a sense the actuator is the gas sealed within the hermetic enclosure and the signal to cause actuation is the reduced external air pressure.

Figure 6:
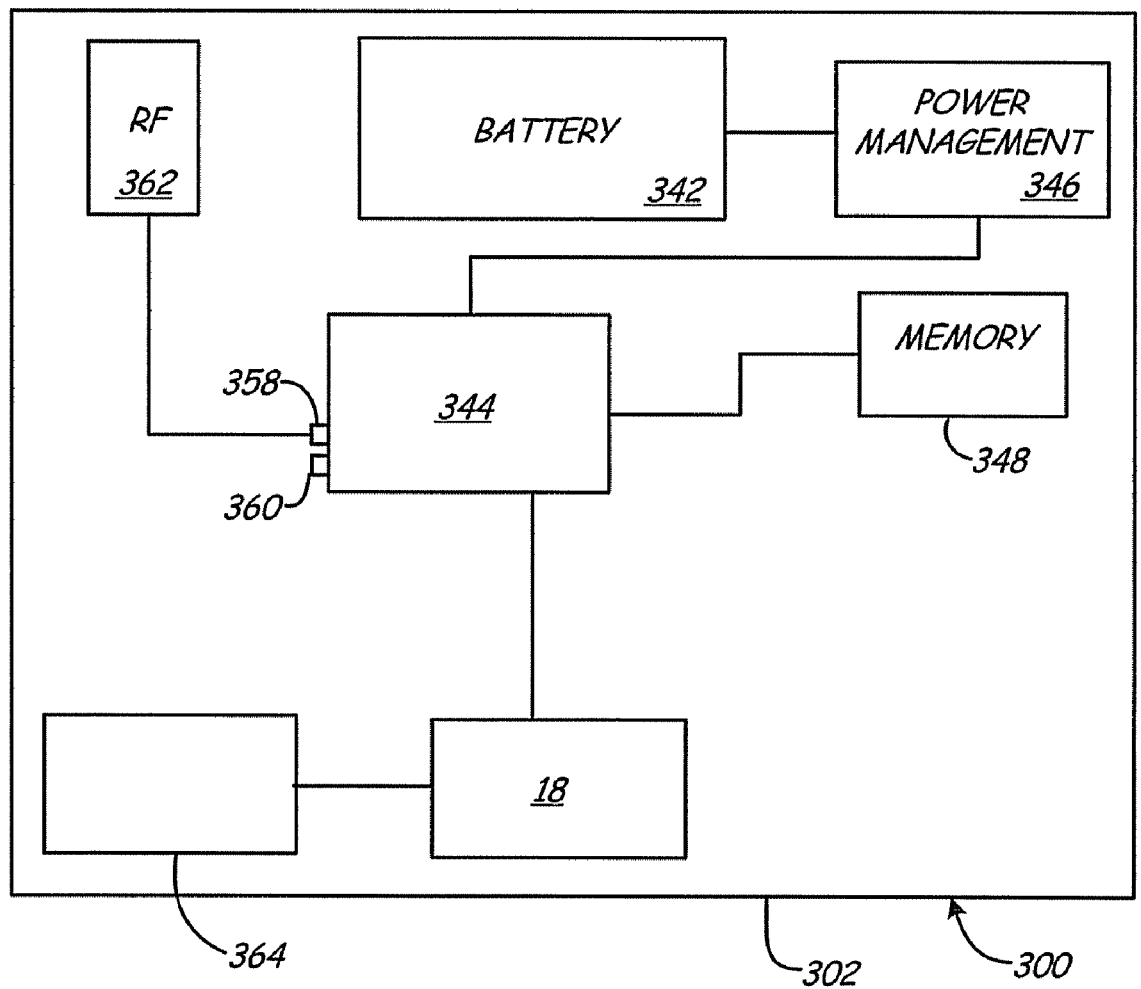
FIG. 6 is a block diagram of circuitry for providing a capacitive-based distance measurement relative to an object of interest in a semiconductor processing system in accordance with an embodiment of the present invention.

FIG. 6 is a diagrammatic view of electronic circuitry within a capacitive-based sensing system in accordance with an embodiment of the present invention. Portion 300 preferably includes circuit board 302 upon which a number of electrical components are mounted. Specifically, battery 342 is preferably mounted on circuit board 302 and coupled to controller 344 via power management module 346. Preferably, power management module 346 is a power management integrated circuit available from Linear Technology Corporation under the trade designation LTC3443. Controller 344 is preferably a microprocessor available from Texas Instruments under the trade designation MSC1121Y5. Controller 344 is coupled to memory module 348 which can take the form of any type of memory, including memory that is internal to the controller as well as memory that is external to the controller. The preferred controller includes internal SRAM, flash RAM, and Boot ROM. Memory module 348 also preferably includes external flash memory having a size of 64K×8. Flash memory is useful for storing such non-volatile data as programs, calibration data and/or other non-changing data as may be required. The internal random access memory is useful for storing volatile data relevant to program operation.

Controller 344 also preferably includes a number of suitable input output/ports 358, 360. These ports are preferably serial ports that facilitate communication between controller 344 and additional devices. Specifically, serial port 358 is coupled to radio-frequency module 362 such that controller 344 is communicatively coupled with external devices via radio-frequency module 362. In one preferred embodiment, radio-frequency module 362 operates in accordance with the well-known Bluetooth standard, Bluetooth core specification version 1.1 (Feb. 22, 2001), available from the Bluetooth SIG (www.bluetooth.com). One example of module 362 is available from Mitsumi under the trade designation WMLC40. Additionally, other forms of wireless communication can be used in addition or instead of module 362. Suitable examples of such wireless communication include any other form of radios frequency communication, acoustic communication, optical, including infrared communication or even communication employing magnetic induction. FIG. 6 shows one or more capacitive plates diagrammatically at block 364, which is coupled to measurement circuitry 18 in accordance with an embodiment of the present invention. Preferably, one or more capacitance plates are operably disposed to sense one or more distances relative to an object of interest in a semiconductor processing system in accordance with an embodiment of the present invention. Additionally, embodiments of the present invention can employ other suitable sensors as may be desired. Examples of additional sensors include thermometers, accelerometers, inclinometers, compasses (magnetic field direction detectors), light detectors, pressure detectors, electric field strength detectors, magnetic field strength detectors, acoustic detectors, humidity detectors, chemical moiety activity detectors, or any other type of detector as may be appropriate.

In operation, controller 344 interacts with measurement circuitry 18, which preferably includes a known sigma-delta analog-digital converter to determine one or more capacitance values. The capacitance values, as described above, are indicative of a distance between the sensor and an object of interest within a semiconductor-processing tool. Additionally, or alternatively, the sensed capacitance may be indicative of a distance of extension required by the sensor to contact the object of interest. In accordance with embodiments of the present invention, a number of such capacitive plates and/or extension sensors can be used to simultaneously, or successively, obtain or otherwise measure distance(s) between the sensor and an object of interest at various locations on the object of interest. In this regard, the distance measurements can be used to provide an indication of parallelism. Accordingly, when the sensor rests upon a platen, the multiple distance measurements provide an indication of parallelism of the platen itself relative to the showerhead. If parallelism itself were the only quantity of interest, the various capacitance measurements themselves could be compared with one another to directly provide an indication of parallelism. However, if knowledge of the distance from the platen to the showerhead is also desired, a priori information stored within memory 348 is used by controller 344 to calculate the distance. For example, in embodiments where the capacitive plates are disposed on a top surface of the sensor, the distance from the sensor to the showerhead is added to the thickness of the sensor itself by controller 344 to provide an overall distance from the platen to the showerhead.

Figure 7:
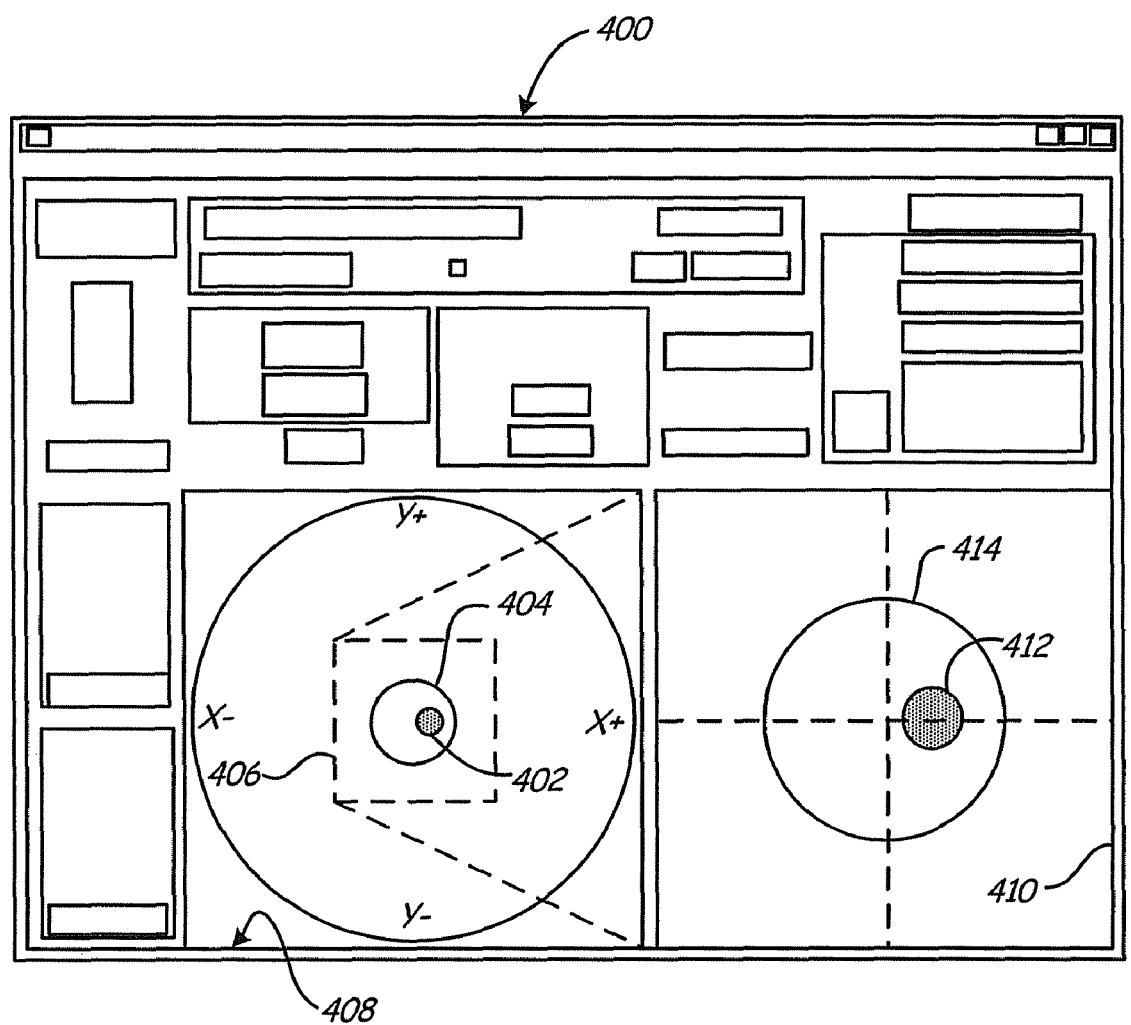
FIG. 7 is an exemplary user interface displaying inclination information obtained from a capacitive distance sensor in accordance with an embodiment of the present invention.

The distance and/or parallelism information can be conveyed electronically to a device remote from the sensor such that the information can be effectively provided to a technician or other interested party. The manner in which the distance and/or parallelism information is presented to the user can vary widely. However, FIG. 7 illustrates a preferred embodiment of a graphical user interface 400 graphically depicting relative inclination in accordance with an embodiment of the present invention. Interface 400 can display the relative position or parallelism, or relative angle of the surfaces graphically, numerically, or both. The degree of parallelism may be indicated numerically, by the use of a bubble-level metaphor, as illustrated in FIG. 7, which shows a small circle 402 positioned within a larger circle 404. The position of circle 402 within circle 404 illustrates, in two dimensions, the relative inclination of the surface to which the sensor is exposed. When the surfaces are parallel in both dimensions, circle 402 is centered within circle 404. Otherwise, circle 402 is shown to one side of center, indicating the side where the so surfaces are farthest apart, with the distance of small circle 402 from the center of large circle 404 indicating the relative inclination of the surfaces. In this case there may be selectable scaling of the relative inclination. For example, box 406 within window 408 shows the relative size of window 410 for scaling purposes. Thus, as inclination becomes more and more pronounced, the distance of circle 402 from the center of circle 404 in window 408 may become extreme, but the relative size of circles 412 and 414 will remain the same with the size of box 406 varying accordingly.

An alternate method of displaying relative inclination provides a circle with a color gradient across the circle. The direction of the gradient indicates the direction of maximum inclination, which may also be indicated by a superimposed line, and the degree of the gradient indicating the relative inclination. For example, in the case of a severe inclination the colors may range from yellow to blue (depending on the color spectrum that is chosen), while a minor inclination may be displayed as a gradient from orange to red. When the surfaces are parallel, the color is uniform, with no gradient, Again, scaling may be selected.

A user or technician of interface 400 can utilize the information provided therein to make informed judgments with respect to machine adjustments during the setup of semiconductor processing tool. For example, the technician can adjust various mechanical settings on the platen to raise or lower certain portions in order to correctly set the distance from the platen to the showerhead as well as the parallelism of the platen and showerhead. Additionally, or alternatively, the inclination information determined by the sensor can be provided directly to a control system within the semiconductor processing tool, or other suitable machinery, to automatically engage mechanical features of the platen to thereby raise or lower certain portions to automatically set distance and/or parallelism. In this manner, at least some semiconductor processing adjustments could be performed automatically based upon wireless information conveyed from the capacitive distance sensor.

Figure 8:
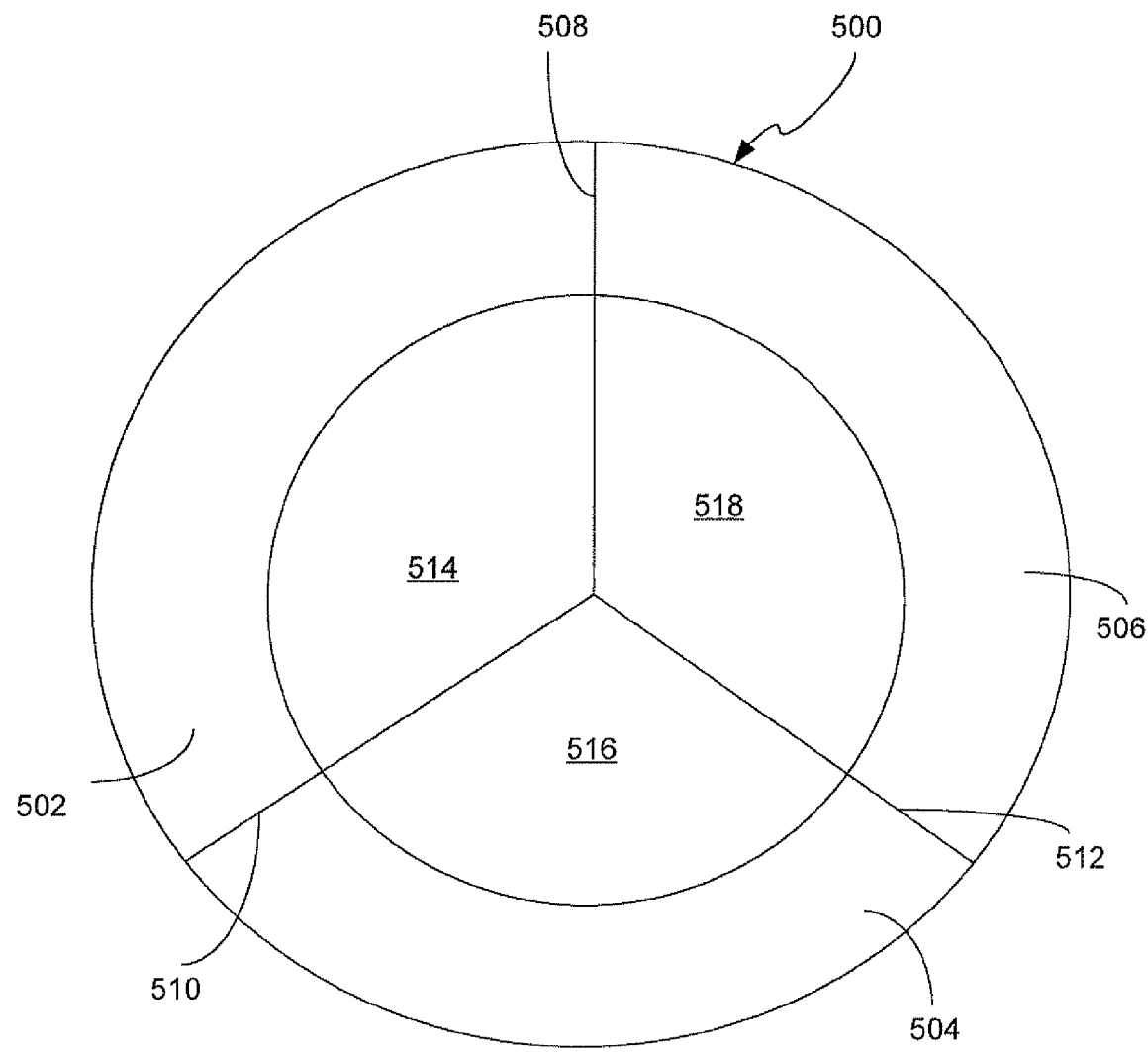
FIG. 8 is a top plan view of a sensor in accordance with an embodiment of the present invention.

FIG. 8 is a top plan view of a sensor in accordance with an embodiment of the present invention. As illustrated in FIG. 8, sensor 500 is preferably circularly-shaped, such as a substrate processed by the semiconductor processing system. Sensor 500 includes three capacitive plates 502, 504, 506 disposed about the periphery of sensor 500, but electrically isolated from one another as illustrated by lines 508, 510 and 512. Additionally, the region of sensor 500 closer to the center includes three additional capacitive plates 514, 516 and 518. Each of plates 514, 516 and 518 are electrically isolated from one another, as well as from the circumferential plates 502, 504 and 506. Each of capacitive plates 502, 504, 506, 514, 516 and 518 are operably coupled to capacitance measurement circuitry 18, through suitable switching circuitry, such as a multiplexer, electronically controlled switches, or the like. It is believed that the accuracy of the distance measurement is proportional to the area of the capacitance plate. In order to simplify calculations, it is preferred that all plate areas be made approximately equal. With the arrangement illustrated in FIG. 8, plate pairs 502/514; 506/518; and 504/516 can be used to measure tilt. Additionally, plate pairs 502/506; 506/504; and 504/502 can be used to measure distance. Additionally, plate pairs 514/518; 518/516; and 516/514 can also be used to measure distance. Further, the distance can be computed as some function, such as an overall average, of all of the measured distances based on the various pairs. Finally, a comparison of various plate pairs can be used to provide an indication of gap shape. For example, when surface 16 on object 14 is intended to be a flat surface, it is of importance to detect a condition in which the surface is not flat but is instead domed, dished, or otherwise misshaped, perhaps as a result of aging. Specifically, plate pairs 502/506 can be used to measure the gap near the periphery of sensor 500, and that gap measurement can be contrasted with a similar gap measurement based on plate pair 514/518 which measure gap near the center of sensor 500. Equal measurements would indicate a gap that is uniform, while unequal measurements would indicate a gap that is not, meaning that at least one of the surfaces is not flat. This is simply one combination that can be used to provide an indication of gap shape, and certainly a vast array of other combinations can be used.

Figure 9:
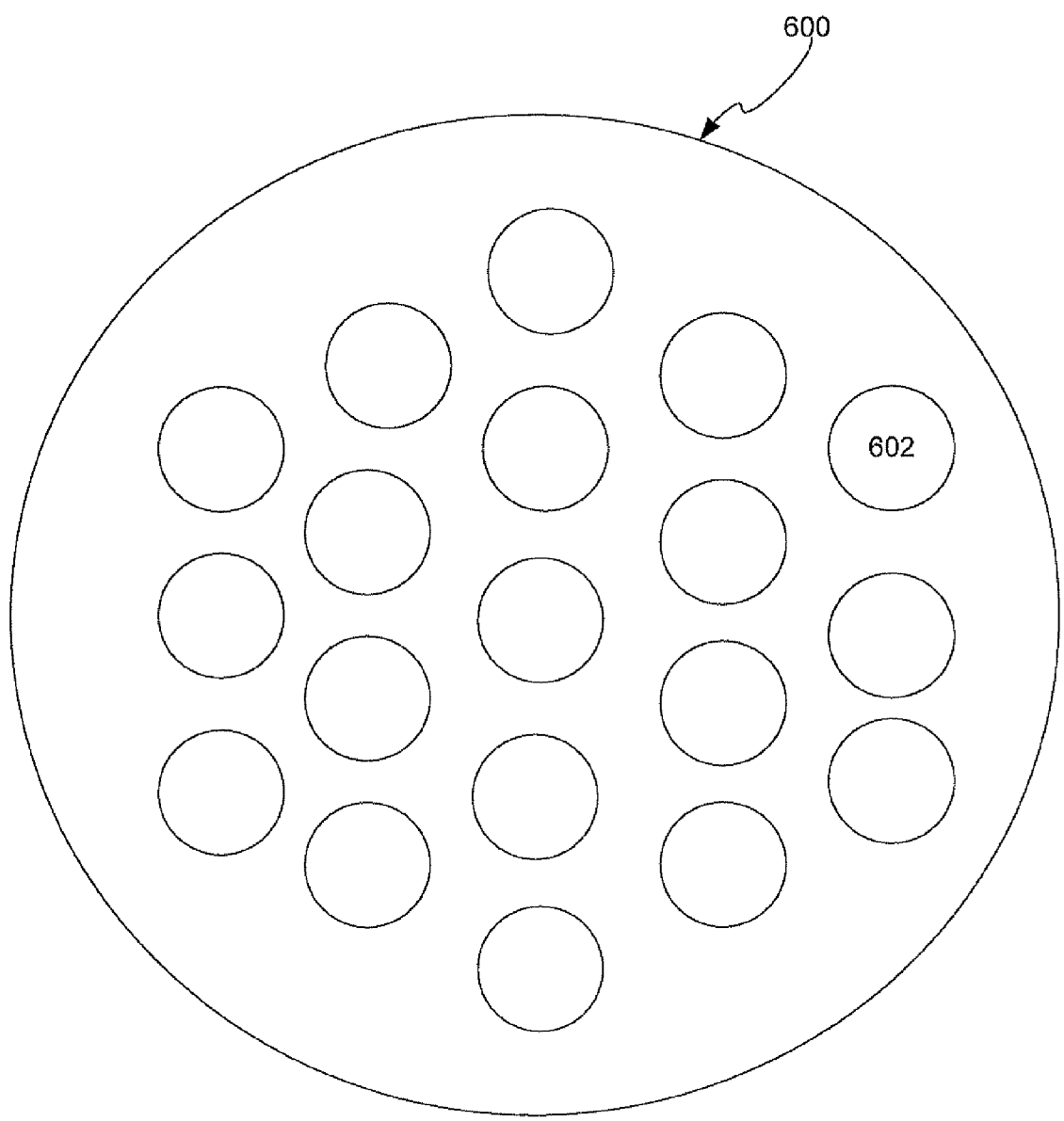
FIG. 9 is a top plan view of a sensor in accordance with another embodiment of the present invention.

FIG. 9 is a top plan view of another sensor for measuring gap distance in accordance with another embodiment of the present invention. Sensor 600 is also preferably round, and includes a large number, in this case 19 individual capacitance plates 602 which are preferably of identical area. The individual plates may be paired to measure distance at a single location, additionally multiple plates can be combined to measure distance in a larger region. This embodiment provides smaller plates to improve the spatial resolution, and larger plates, formed of combinations of smaller plates, that can improve accuracy. Additionally, the larger plates are believed to be less sensitive to spatial non-uniformity.

Although the present invention has been described with reference to preferred embodiments, workers skilled in the art will recognize that changes may be made in form and detail without departing from the spirit and scope of the invention.

What is claimed is:

1. A sensor for sensing a shape of a gap between the sensor while resting on a platen and a showerhead within a semiconductor processing chamber, the sensor including:
   a housing;
   a power source disposed within the housing;
   wireless communication circuitry coupled to the power source;
   a controller coupled to wireless communication circuitry and to the power source;
   a plurality of capacitive plates, each forming a capacitor with the showerhead having a capacitance that varies with the gap;
   measurement circuitry coupled to the controller and to the plurality of capacitive plates, the measurement circuitry measuring a capacitance relative to each capacitive plate and provide indications thereof to the controller;
   wherein the controller provides an indication relative to the shape of the gap based, at least in part, upon the measured capacitances; and
   wherein at least one capacitive plate is used to measure two different capacitances while resting on the platen.

2. The sensor of claim 1, wherein the plurality of capacitive plate pairs includes at least three capacitive plate pairs.

3. The sensor of claim 1, wherein each capacitive plate is isolated from all other capacitive plates.

4. The sensor of claim 1, wherein the plurality of capacitive plates includes at least three capacitive plates disposed equally about a periphery of the sensor.

5. The sensor of claim 4, wherein the plurality of capacitive plates further includes at least three capacitive plates disposed proximate a center of the sensor.

6. The sensor of claim 5, wherein all capacitive plates have the same area.

7. The sensor of claim 1, wherein the capacitive plates are arranged symmetrically on the surface of the sensor.

8. The sensor of claim 7, wherein all capacitive plates have the same area.

9. The sensor of claim 8, wherein the plurality of capacitive plates include nineteen capacitive plates.

10. The sensor of claim 1, wherein the shape is domed.

11. The sensor of claim 1, wherein the shape is dished.

* * * * *